(12) United States Patent
MacGugan

(10) Patent No.: US 7,467,552 B2
(45) Date of Patent: Dec. 23, 2008

(54) MINIATURE PACKAGE FOR TRANSLATION OF SENSOR SENSE AXIS

(75) Inventor: Douglas C. MacGugan, Bellevue, WA (US)

(73) Assignee: Honeywell International Inc., Morristown, NJ (US)

( * ) Notice: Subject to any disclaimer, the term of this patent is extended or adjusted under 35 U.S.C. 154(b) by 418 days.

(21) Appl. No.: 11/272,154

(22) Filed: Nov. 10, 2005

(65) Prior Publication Data
US 2007/0101812 A1    May 10, 2007

(51) Int. Cl.
G01P 1/02    (2006.01)
(52) U.S. Cl. .................................................. 73/493

(58) Field of Classification Search ............... 73/866.5, 73/493
See application file for complete search history.

(56) References Cited

U.S. PATENT DOCUMENTS

| | | | |
|---|---|---|---|
| 5,554,806 | A | 9/1996 | Mizuno et al. |
| 5,616,863 | A | 4/1997 | Koen |
| 6,060,780 | A | 5/2000 | Ohta et al. |
| 6,109,105 | A | 8/2000 | Kubena et al. |
| 6,577,134 | B2 | 6/2003 | Farruggia et al. |
| 2003/0209789 | A1 | 11/2003 | Hanson et al. |
| 2004/0085159 | A1 | 5/2004 | Kubena et al. |
| 2004/0169244 | A1* | 9/2004 | MacGugan ................. 257/416 |

* cited by examiner

Primary Examiner—Hezron Williams
Assistant Examiner—John Fitzgerald

(57) ABSTRACT

A ceramic L-shaped or T-shaped packaging apparatus for a Micro Electro-Mechanical System (MEMS) inertial sensor die that translates the sensor sense axis perpendicular to the normal input plane for direct attachment to a system-level printed circuit board (PCB).

12 Claims, 7 Drawing Sheets

MINIATURE PACKAGE FOR TRANSLATION OF SENSOR SENSE AXIS

FIELD OF THE INVENTION

The present invention relates to packaging of sensor devices and methods, and in particular to 3-dimensional structures for packaging of Micro Electro-Mechanical System (MEMS) sensor devices.

BACKGROUND OF THE INVENTION

Micro Electro-Mechanical System (MEMS) inertial sensors, including accelerometers, gyroscopes and magnetometers, are generally well-known and commercially available from Honeywell International, Incorporated, the assignee of the present patent application. MEMS inertial sensors typically have a single input axis. To achieve an effective 3-axis inertial system three individual MEMS inertial sensors are arranged in an orthogonal manner. For example, three individual inertial sensors may be mounted directly on the host structure to be monitored. Alternatively, the individual MEMS inertial sensors are combined in 3-dimensional structural package for sensing inputs in three orthogonal directions, as disclosed by the inventor of the present invention in U.S. Pat. No. 6,918,297, Miniature 3-Dimensional Package for MEMS Sensors, which is assigned to the assignee of the present application and is incorporated herein by reference.

However, orthogonal arrangements of MEMS inertial sensor typically require at least one sensor, and sometimes two, to be arranged perpendicular to an easily available mounting plane. Also, most inertial sensors require packaging of a type that maintains sealing of their internal environment as such devices typically must operate in either a vacuum or stable atmosphere such as dry nitrogen. Typical MEMS sensor packaging is designed around planar integrated circuitry packages such as Leadless Chip Carriers, Ball-Grid-Arrays, or Flip-Chip or Chip-Scale Level packages. These IC packages present the MEMS sensor sense axis in only one orientation. Assembly of a functional 3-axis inertial reference system (IRS) requires at least one, and sometimes two, of these IC packages to be placed perpendicular to the surface of a functional electronic printed circuit board. Such mounting constraints require increased IRS size to accommodate the MEMS IC package mounting perpendicular to the PCB. Additional issues that arise include the need for routing signals from the MEMS IC package to the PCB, assembly cost increases associated with the non-traditional orientation of the IC package, and compromised reliability due to straining of the MEMS IC package attachment through operational environments.

SUMMARY OF THE INVENTION

The present invention is a miniature package structure for a Micro Electro-Mechanical System (MEMS) inertial sensor that eliminates problems associated with translating a sense axis of an inertial MEMS sensor in a 3-axis Inertial Reference System (IRS). The miniature package structure of the present invention provides mounting of a translated sense axis MEMS inertial sensor to an IRS PCB in a hermetic IC-type package that can be processed through normal SMT attachment and assembly processes. The miniature package structure of the present invention incorporates the benefits of normal MEMS sensor packaging assembly. The miniature package structure of the present invention translates the sense axis perpendicular to the normal input plane, and permits hermetic sealing of the package MEMS sensor. Additionally, the miniature package structure of the present invention avoids the penalties of larger size, higher cost, system assembly issues and lower reliability.

Accordingly, the present invention provides an apparatus and method for a miniature package structure for a Micro Electro-Mechanical System (MEMS) inertial sensor having a translated sense axis. The apparatus of the present invention includes a ceramic L-shaped or T-shaped base bracket having a body portion and a leg extending from the body, the body is formed with a substantially planar recessed die attach surface plane that is substantially perpendicular to an interior mounting surface of the leg portion. The die attach surface plane is structured to accept a MEMS sensor die with its effective sense axis translated relative to a base leg of the L or T shape.

According to different aspects of the invention, the body is adapted to accommodate either wire-bond or flip-chip attach of the MEMS inertial sensor die.

According to one aspect of the invention, the interior surface of the leg portion is substantially planar and formed with multiple interface pads adapted for direct attachment to a system-level PCB. Multiple mutually isolated electrical signal carriers extend between the body mounting surface and the interface pads on the interior surface of the leg portion for carrying ground, drive, feedback, and output signals. According to different aspects of the invention, the interface pads on the interior surface of the leg portion are standard Surface Mount Technology solder reflow pads, or are adapted for either solder ball or flip-chip attachment.

According to one aspect of the invention, a protective lid or cover is hermetically sealed to the walls surrounding the recessed die attach surface plane above the MEMS inertial sensor die.

The MEMS inertial sensor package of the present invention is fabricated using standard IC packaging fabrication methods. According to different aspects of the invention, the ceramic base package is fabricated using known processes such as Low-Temperature Co-Fired Ceramic (LTCC) or High-Temperature Co-Fired Ceramic (HTCC). According to one aspect of the invention, conventional plastic lamination methods are utilized to build the package using organic substrates.

According to one aspect of the invention, a MEMS inertial sensor die is attached to the recessed die attach surface plane and is electrically interfaced to the electrical signal carriers thereon using conventional wire-bond, solder ball, or flip-chip attach techniques.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

The present invention is an apparatus and method for a miniature package structure for a Micro Electro-Mechanical System (MEMS) inertial sensor having a translated sense axis. The apparatus of the present invention includes a substantially rigid L-shaped or T-shaped base bracket having a body portion and a leg extending from the body, the body is formed with a substantially planar recessed die attach surface plane that is substantially perpendicular to an interior mounting surface of the leg portion. The die attach surface plane is structured to accept a MEMS sensor die with its effective sense axis translated relative to a base leg of the L or T shape.

The interior surface of the leg portion is substantially planar and formed with multiple interface pads adapted for direct attachment to a system-level printed circuit board (PCB). Multiple mutually isolated electrical signal carriers extend between the body mounting surface and the interface pads on the interior surface of the leg portion for carrying ground, drive, feedback, and output signals. When the interior surface of the leg portion is attached to a top or bottom surface of a system-level PCB, the input axis of a MEMS sensor die mounted to the recessed die attach surface plane is translated from an axis perpendicular to the PCB surface to an orthogonal axis in the plane of the PCB surface.

Figure 1:
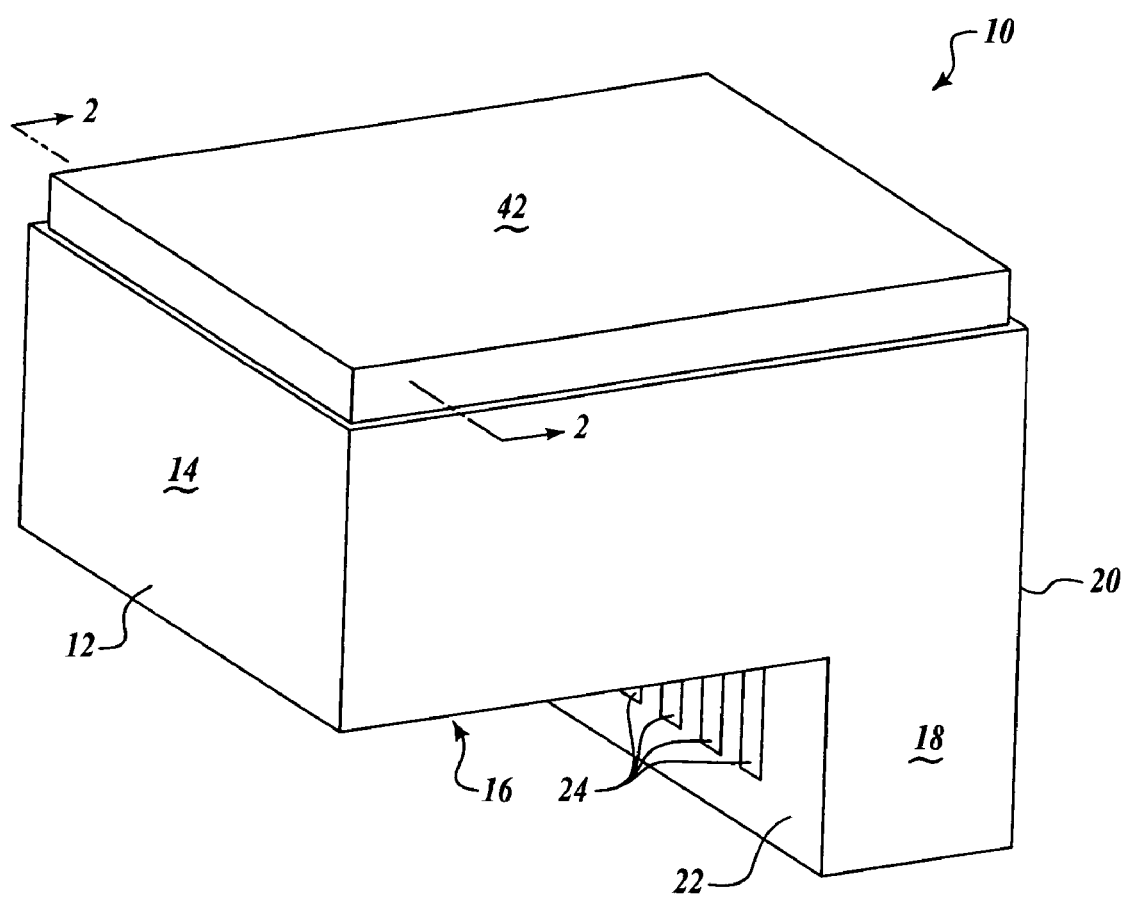
FIG. 1 is a perspective view of a miniature MEMS inertial sensor package of the invention.

FIG. 1 is a miniature MEMS inertial sensor package 10 fabricated using standard IC packaging fabrication methods. Package 10 includes a substantially rigid T-shaped or L-shaped base bracket 12 formed of a substantially rigid material, such as ceramic, using conventional IC packaging fabrication methods and processes. For example, base bracket 12 is formed using Low-Temperature Co-Fired Ceramic (LTCC) or High-Temperature Co-Fired Ceramic (HTCC) processes. Alternatively, plastic lamination methods are utilized to form base bracket 12 is using organic substrates. Base bracket 12 is fabricated using layers of the selected substrate material.

Base bracket 12 includes a body portion 14 having a generally rectangular footprint formed by a body base surface 16, and a leg portion 18 extending at a substantially right angle from body base surface 16. When base bracket 12 is formed having an L-shape (shown), leg portion 18 extends adjacent to one outer side surface 20 of bracket body 14. Leg portion 18 includes a substantially planar interior interface surface 22 opposite from and substantially perpendicular to body base surface 16 of bracket body 14. Electrical interface pads 24 formed on interior interface surface 22 of leg portion 18 are adapted to permit direct attachment to a system-level PCB. Interface pads 24 are implemented as standard (SMT) Surface Mount Technology pads, or alternatively are structured for solder ball or flip-chip attachment.

Figure 2:
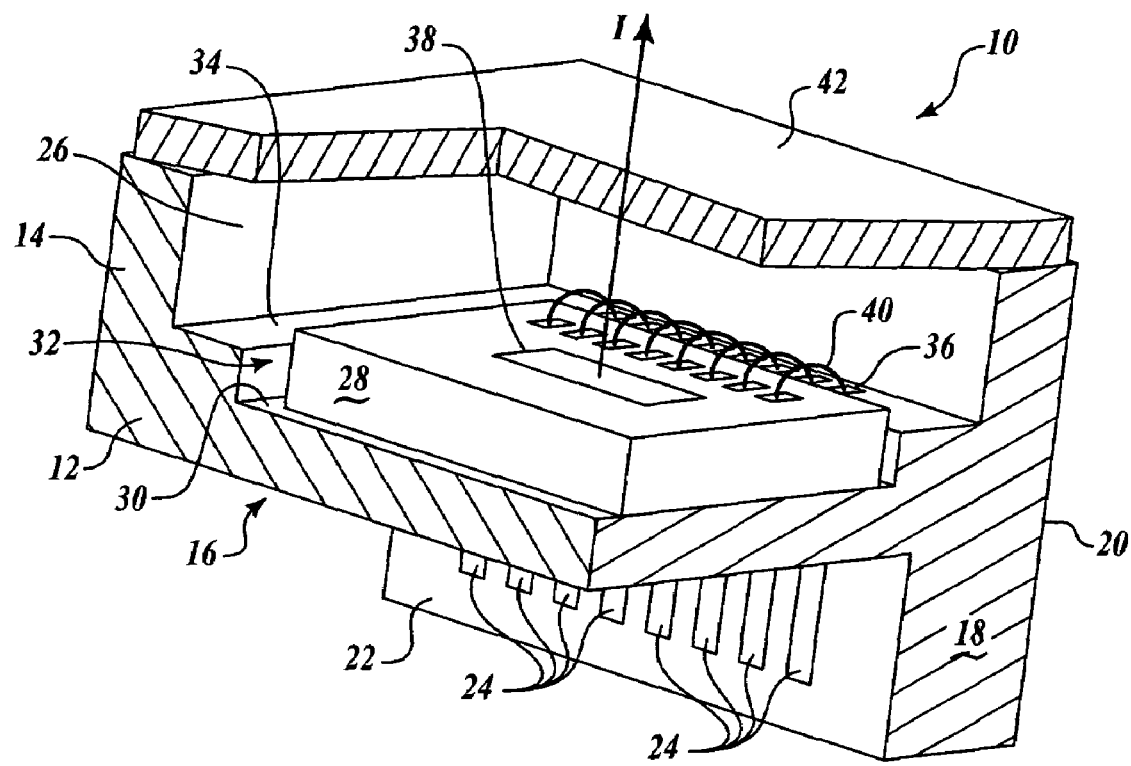
FIG. 2 is another perspective view of the miniature MEMS inertial sensor package of the invention.

FIG. 2 illustrates by example and without limitation an interior portion 26 of bracket body 14 wherein a MEMS inertial sensor die 28 is hermetically sealed. For example, interior portion 26 of bracket body 14 includes a substantially planar die attach surface plane 30 formed as the floor of a die cavity 32. Die attach surface plane 30 is formed substantially perpendicular to interior interface surface 22 of leg portion 18. By coincidence die attach surface plane 30 is also parallel to body base surface 16 of bracket body 14, but such parallelism is not critical to practice of the invention. Die attach surface plane 30 is optionally recessed relative to a surrounding shelf structure 34 within the hermetically sealed bracket body interior portion 26. Die attach of MEMS inertial sensor die 28 is accomplished using either eutectic or epoxy attach methods.

Multiple electrical interface contacts 36 are provided, for example on surrounding shelf structure 34, for coupling MEMS sensor die 28 to circuitry buried within base bracket 12 and leading to electrical interface pads 24 on interior interface surface 22 of leg portion 18. Routing circuitry within the MEMS inertial sensor package 10 routes the appropriate sensor ground, power and output signals through T-shaped or L-shaped base bracket 12. T-shaped or L-shaped leg feature 18 of base bracket 12 allows electrical traces to interface to a mounting surface perpendicular to die attach surface plane 30 of the MEMS sensor die attachment, for example a system level PCB. T-shaped or L-shaped leg feature 18 thus translates an effective sense axis I of a MEMS inertial sensor 38 mounted in sensor die 28 from the die attach configuration (either parallel or perpendicular to die attach surface plane 30) to an orthogonal direction substantially perpendicular to an original die orientation. Typical MEMS sensors have a single sense axis I which is either parallel to the die 28 (in-plane sense axis) or perpendicular (out-of-plane sense axis). The direction of the MEMS inertial sense axis I is commonly determined by considerations, such as ease of fabrication, performance issues, and physics, that are adequately addressed by relevant references in the art and so are not addressed here.

According to one embodiment of the invention, electrical interface contacts 36 are embodied as wire-bond contacts deposited on surrounding shelf structure 34. After MEMS sensor die 28 is attached in die cavity 32, wire bonds 40 are formed between MEMS sensor die 28 and wire-bond contacts 36.

A protective ceramic lid or cover 42 hermetically seals die cavity 32 for containing an internal environment, such as vacuum or stable atmosphere, e.g., dry nitrogen. For example, lid 42 is attached to walls 45 surrounding recessed die cavity 32 and enclosing interior portion 26 of the bracket body 14 using conventional hermetic sealing methods, such as brazing, soldering, or epoxy. Hermetic sealing of MEMS sensor die cavity 32 may include incorporation of a getter for combining with trace elements in the hermetically sealed internal environment.

Figure 3:
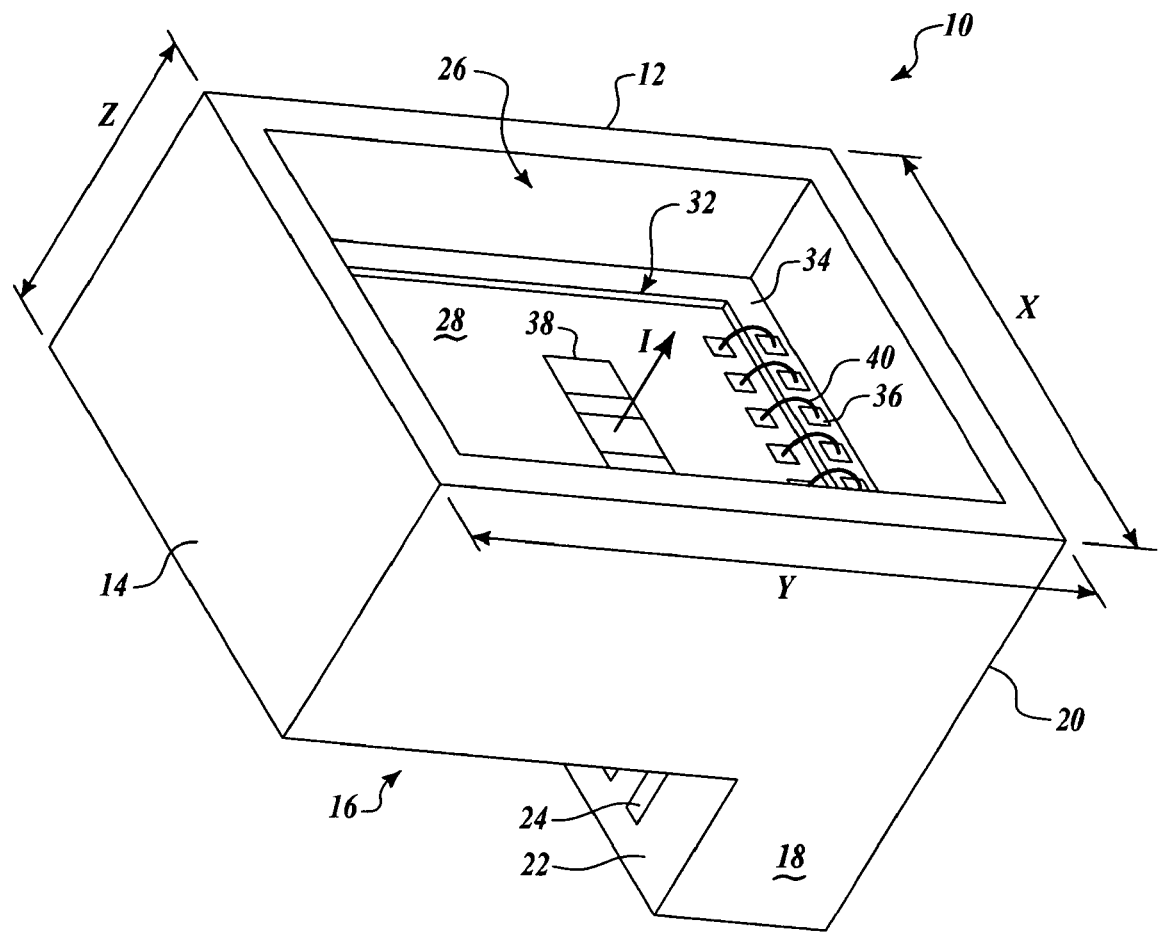
FIG. 3 is another perspective view of the miniature MEMS inertial sensor package of the invention having a lid portion removed for clarity.

FIG. 3 is shown with lid 42 removed for clarity. As illustrated, shelf structure 34 surrounding die cavity 32 is only used to provide area within MEMS inertial sensor package 10 for positioning wire-bond contacts 36. Accordingly, shelf structure 34 may be eliminated when MEMS sensor die 28 is mounted using electrical interface contacts 36 embodied as flip-chip contacts. Elimination of wire-bond shelf structure 34 permits walls 45 to be moved together along one or both orthogonal directions X and Y, whereby the overall size of package 10 is reduced.

Additionally, much of the volume of interior portion 26 of bracket body 14 above sensor die 28 is provided only to make space for routing of wire bonds 40 between MEMS sensor die 28 and wire-bond electrical interface contacts 36. Accordingly, the height of walls 45 may also be reduced when wire bonds 40 are eliminated, whereby the overall height dimension Z of package 10 is reduced.

Figure 4:
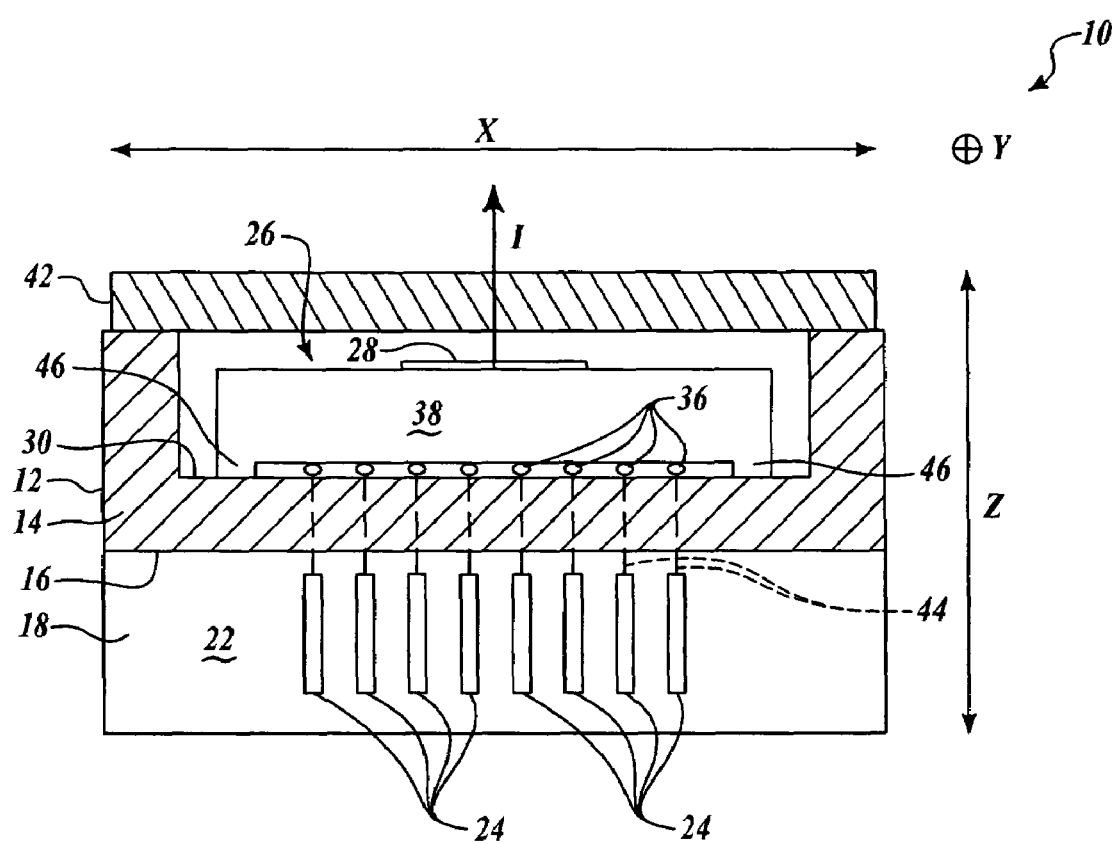
FIG. 4 is a cross-sectional view of the miniature MEMS inertial sensor package of the invention having a MEMS sensor die attached using flip-chip contacts.

FIG. 4 illustrates by example and without limitation die cavity 32 having electrical interface contacts 36 are embodied as solder ball or flip-chip contacts between MEMS sensor die 28 and planar die attach surface plane 30. Solder ball and flip-chip attachment of MEMS sensor die are well-known, as disclosed by Eskridge in U.S. patent application Ser. No. 10/804,609, FLIP CHIP BONDED MICRO-ELECTROMECHANICAL SYSTEM (MEMS) DEVICE, which is assigned to the assignee of the present patent application and incorporated in its entirety herein by reference. Circuitry (indicated by dashed lines) buried within base bracket 12 provide several different electrical signal carriers 44 between solder ball or flip-chip electrical interface contacts 36 and different electrical interface pads 24 on interior interface surface 22 of leg portion 18 for carrying ground, drive, feedback, and output signals of MEMS inertial sensor 38.

Stand-offs 46 may be formed on MEMS sensor die 28 for ensuring parallel orientation of MEMS inertial sensor 38 to planar die attach surface plane 30 within die cavity 32. Use of flip-chip contacts as electrical interface contacts 36 permits optional elimination of surrounding wire-bond contact shelf structure 34 and shortening of walls 45 since no overhead space is required for routing of wire bonds 40. Accordingly, the overall volume of package 10 is reduced to a minimum without any loss of performance or reliability.

Figure 5:
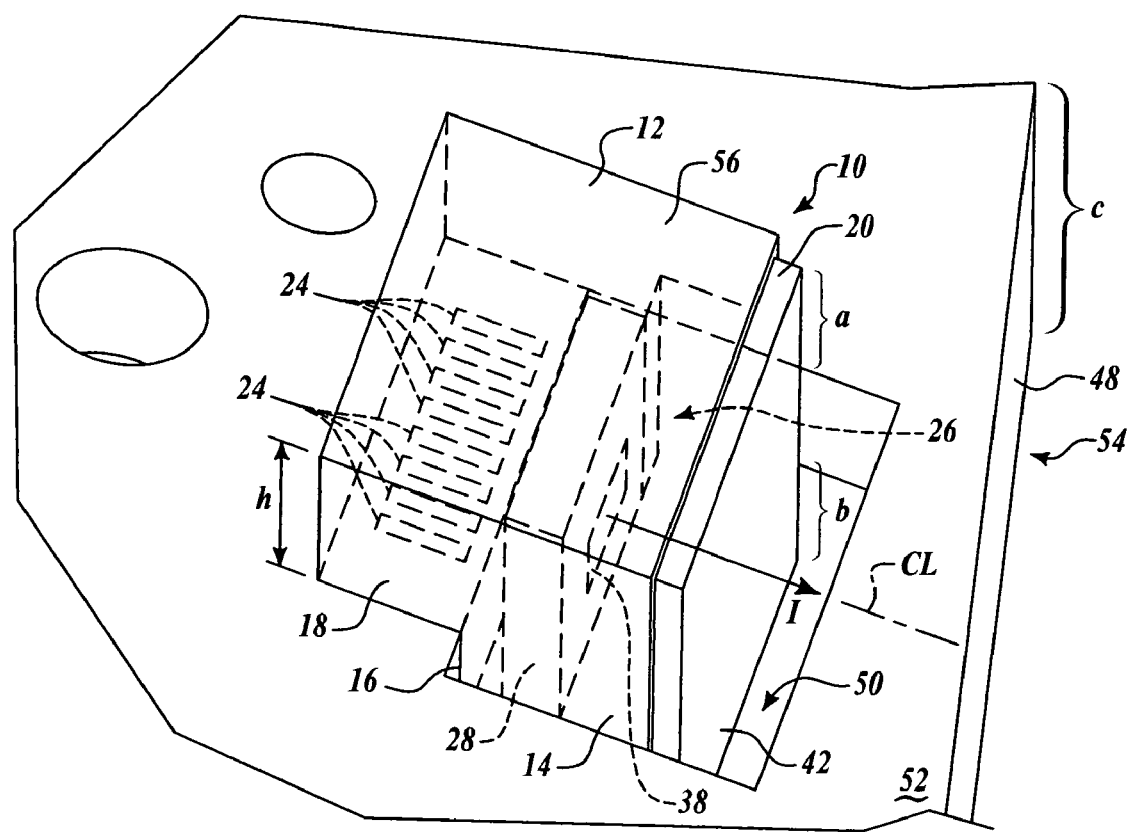
FIG. 5 illustrates the MEMS inertial sensor package of the invention having a translated sense axis being mounted on a first side of a system-level printed circuit board (PCB)

FIG. 5 illustrates MEMS inertial sensor package 10 having a translated sense axis as mounted on a system-level printed circuit board (PCB) 48. Here, MEMS sensor package 10 is positioned with its bracket body 14 partially through a routed opening 50 through PCB 48 with interior interface surface 22 of leg portion 18 being mounted on a surface 52 of PCB 48. SMT or other electrical interface pads 24 on interior interface surface 22 of leg portion 18 are coupled to routing pads on PCB surface 52. Accordingly, MEMS sensor package 10 is mounted with only a portion of base bracket body 14 positioned above surface 52 of system-level PCB 48, while another portion of base bracket body 14 is positioned below PCB 48 and extends on an opposite side 54 thereof from surface 52. The described mounting of MEMS sensor package 10 translates effective sense axis I of MEMS inertial sensor 38 from the die attach configuration (either parallel or perpendicular to die attach surface plane 30) to an orthogonal direction substantially perpendicular to an original die orientation and substantially parallel to surface 52 of system-level PCB 48.

Interior interface surface 22 of leg portion 18 having electrical interface pads 24 is offset relative to a centerline CL of body base surface 16 of bracket body 14 such that leg portion 18 forms an offset T-shape with bracket body 14. Optionally, an outer surface 56 of leg portion 18 is substantially contiguous with outer side surface 20 of bracket body 14 such that leg portion 18 forms an L-shape with bracket body 14. The offset T-shape or L-shape causes at least a portion of bracket body 14 to be positioned below surface 52 of system-level PCB 48. The offset shape of base bracket 12 thus helps reduce an overall extension of base bracket 12 above one or both surfaces 52 and 54 of system-level PCB 48.

Optionally, the heights of a first portion a of translated MEMS package 10 above surface 52 of system-level PCB 48 and of a second portion b below the system-level PCB are both less than or equal to heights of other electronic components on a double-sided system level PCB 48.

Body portion 14 of base bracket 12 may extend substantially equal distances a and b on opposite surfaces 52 and 54 of system-level PCB 48. In other words, a height h of leg portion 18 is equal to second portion b plus a thickness c of PCB 48. Accordingly, an overall mounting height h of the translated sense axis MEMS sensor package 10 is minimized.

Figure 6:
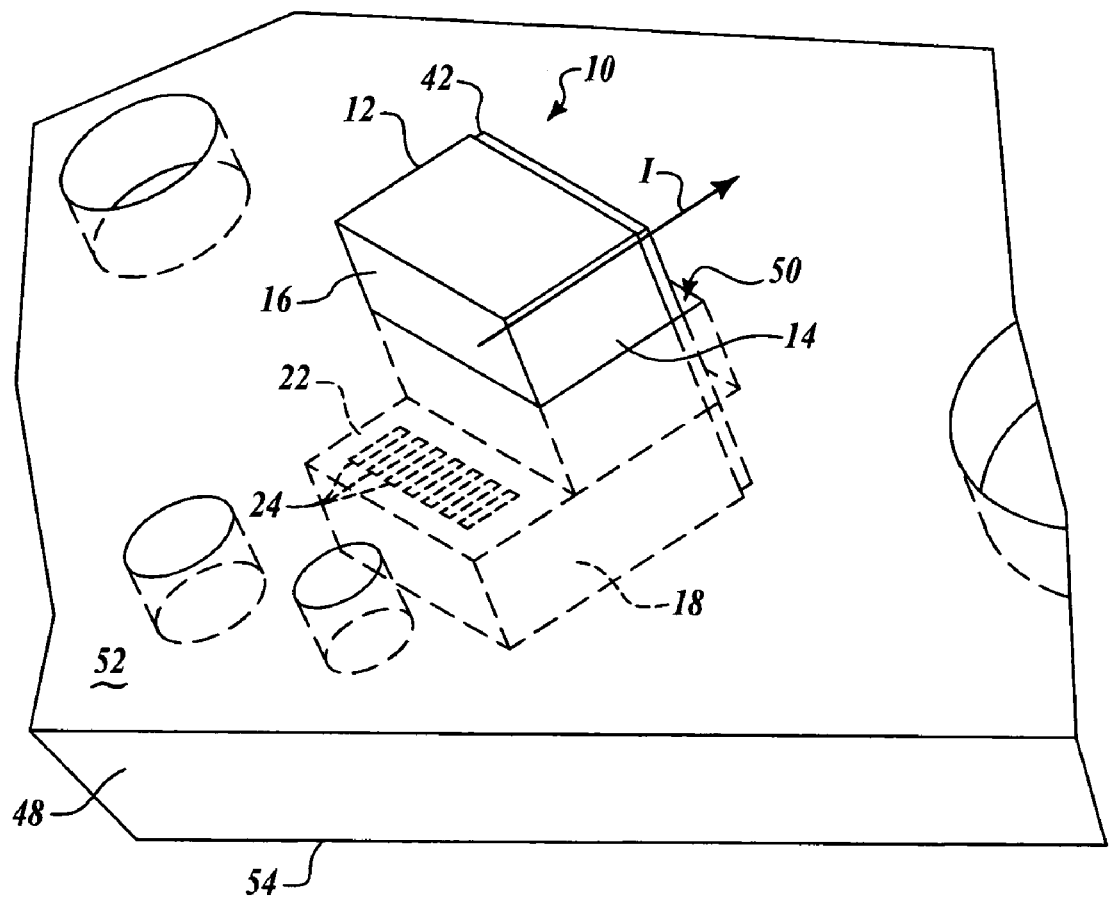
FIG. 6 illustrates the MEMS inertial sensor package of the invention having a translated sense axis being mounted on a second side of the system-level printed circuit board (PCB)

FIG. 6 illustrates leg portion 18 of MEMS sensor package 10 being mounted on opposite side 54 of PCB 48, whereby effective sense axis I of MEMS inertial sensor 38 is translated from the die attach configuration (either parallel or perpendicular to die attach surface plane 30) to an original die orientation and substantially parallel to surface 52 of system-level PCB 48.

Figure 7:
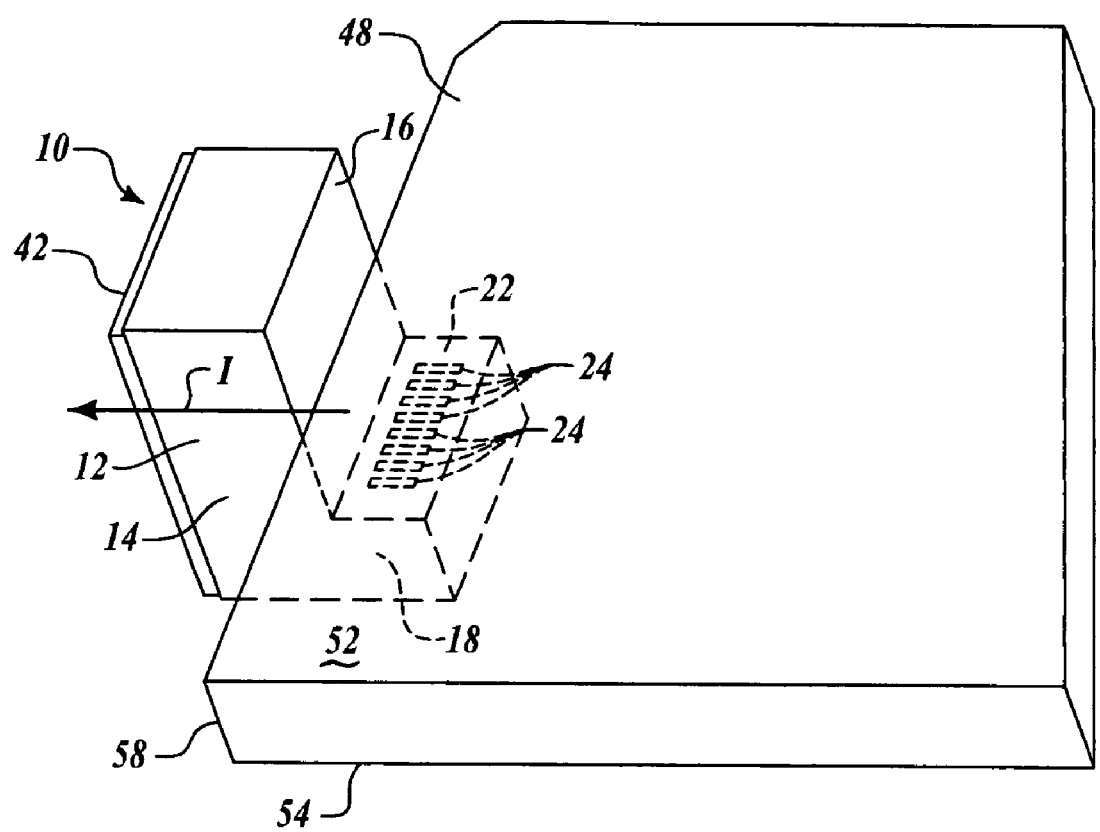
FIG. 7 illustrates the MEMS inertial sensor package of the invention having a translated sense axis being mounted on an edge surface of the system-level printed circuit board (PCB).

FIG. 7 illustrates MEMS sensor package 10 being mounted on an edge 58 of PCB 48, whereby effective sense axis I of MEMS inertial sensor 38 is translated from the die attach configuration (either parallel or perpendicular to die attach surface plane 30) to an original die orientation and substantially parallel to surface 52 of system-level PCB 48.

While the preferred embodiment of the invention has been illustrated and described, it will be appreciated that various changes can be made therein without departing from the spirit and scope of the invention.

What is claimed is:

1. An apparatus for orthogonally translating an input axis of a Micro Electro-Mechanical System (MEMS) sensor, the apparatus comprising:
   a bracket having a bracket body and a bracket leg extending therefrom, the bracket body and bracket leg forming respective first and second substantially planar and mutually orthogonal surfaces;
   the first orthogonal surfaces formed by the bracket body further comprises a MEMS sensor die attach surface plane structured for attaching a MEMS sensor die;
   the second orthogonal surface formed by the bracket leg further comprises a plurality of electrical interface contacts structured for interfacing with a host structure that is to be monitored; and
   a plurality of electrical signal carriers communicating between a portion of the bracket body adjacent to the MEMS sensor mounting surface and the plurality of electrical interface contacts positioned on the interfacing surface of the bracket leg,
   wherein the bracket leg forms one of an offset T-shape and an L-shape with the bracket body.

2. The apparatus of claim 1, further comprising a plurality of electrical interface contacts adjacent to die attach surface plane, the electrical interface contacts communicating with the electrical signal carriers.

3. The apparatus of claim 2 wherein the electrical interface contacts further comprise electrical interface contacts selected from the group of electrical interface contacts consisting of: wire-bond contacts, solder ball contacts, and flip-chip contacts.

4. The apparatus of claim 1 wherein the bracket body further comprises a recessed die cavity.

5. The apparatus of claim 4 wherein the die cavity is further hermetically sealed.

6. The apparatus of claim 5 wherein the interface surface of bracket leg is further offset relative to a base surface of the bracket body.

7. The apparatus of claim 5, further comprising a single MEMS inertial sensor die mounted on the die attach surface plane and electrically interfaced with the electrical signal carriers.

8. The apparatus of claim 4 wherein the bracket body further comprises a plurality of electrical interface contacts adjacent to the recessed die cavity, the electrical signal carriers are in electrical communication with the electrical interface contacts adjacent to the recessed die cavity and the electrical interface contacts positioned on the interfacing surface of the bracket leg.

9. The apparatus of claim 8 wherein the plurality of electrical interface contacts further comprises a plurality of flip-chip electrical interface contacts formed on the MEMS sensor die attach surface plane.

10. The apparatus of claim 8, further comprising a right angle formed between the bracket body and bracket leg.

11. The apparatus of claim 8 wherein the plurality of electrical interface contacts further comprises a plurality of wire-bond contacts adjacent to the recessed die cavity.

12. The apparatus of claim 11 wherein the bracket body further comprises a shelf structure adjacent to and raised relative to the recessed die cavity, the plurality of wire-bond contacts being deposited on the shelf structure.

* * * * *